(12) United States Patent
Hyun et al.

(10) Patent No.: US 8,497,533 B2
(45) Date of Patent: Jul. 30, 2013

(54) THREE-DIMENSIONAL SEMICONDUCTOR MEMORY DEVICE

(75) Inventors: Sungwoo Hyun, Seoul (KR); Byeongchan Lee, Yongin-si (KR); Sunghil Lee, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/554,038

(22) Filed: Jul. 20, 2012

(65) Prior Publication Data

US 2012/0287694 A1  Nov. 15, 2012

Related U.S. Application Data

(62) Division of application No. 12/938,642, filed on Nov. 3, 2010, now Pat. No. 8,268,687.

(30) Foreign Application Priority Data

Nov. 3, 2009  (KR) .................. 10-2009-0105412

(51) Int. Cl.
*H01L 29/66* (2006.01)

(52) U.S. Cl.
USPC 257/260; 365/63; 257/E29.246; 257/E29.309

(58) Field of Classification Search
USPC .............. 438/268, 270, 272; 257/301–304, 257/E21.676, E21.693
See application file for complete search history.

(56) References Cited

U.S. PATENT DOCUMENTS

| 5,128,273 | A | 7/1992 | Ema |
|---|---|---|---|
| 7,539,056 | B2 | 5/2009 | Katsumata et al. |
| 7,994,011 | B2 | 8/2011 | Park et al. |
| 8,027,197 | B2 | 9/2011 | Shim et al. |
| 8,053,302 | B2 | 11/2011 | Seol et al. |
| 8,076,198 | B2 | 12/2011 | Lee et al. |
| 2008/0179659 | A1 | 7/2008 | Enda et al. |
| 2008/0315291 | A1 | 12/2008 | Kito et al. |
| 2009/0001419 | A1 | 1/2009 | Han et al. |
| 2009/0146190 | A1 | 6/2009 | Fukuzumi et al. |
| 2010/0109071 | A1 | 5/2010 | Tanaka et al. |

FOREIGN PATENT DOCUMENTS

| JP | 2008-186868 A | 8/2008 |
|---|---|---|
| JP | 2008-244485 A | 10/2008 |
| JP | 2009-004510 A | 1/2009 |
| KR | 10-2008-0070583 A | 7/2008 |
| KR | 10-0855990 B1 | 8/2008 |
| KR | 10-2008-0112131 A | 12/2008 |

*Primary Examiner* — Leonard Chang
(74) *Attorney, Agent, or Firm* — Lee & Morse, P.C.

(57) ABSTRACT

An embodiment is directed to a method of fabricating a semiconductor memory device, the method including preparing a substrate having a cell array region and a contact region, forming a thin film structure on the substrate, including forming sacrificial film patterns isolated horizontally by a lower isolation region, the lower isolation region traversing the cell array region and the contact region, and forming sacrificial films sequentially stacked on the sacrificial film patterns, and forming an opening that penetrates the thin film structure to expose the lower isolation region of the cell array region, the opening being restrictively formed in the cell array region.

8 Claims, 22 Drawing Sheets

THREE-DIMENSIONAL SEMICONDUCTOR MEMORY DEVICE

CROSS REFERENCE TO RELATED APPLICATION

This is a divisional application based on pending application Ser. No. 12/938,642, filed Nov. 3, 2010, the entire contents of which is hereby incorporated by reference.

BACKGROUND

1. Field

Embodiments relate to a semiconductor memory device and a method of fabricating the same.

2. Description of the Related Art

A demand for a higher degree of integration in semiconductor memory devices has increased, in order to satisfy demands for excellent performance and low price in response to user's needs. In semiconductor memory devices, a higher degree of integration is particularly important, since the degree of integration is a significant factor in determining prices.

SUMMARY

An embodiment is directed to a method of fabricating a semiconductor memory device, the method including preparing a substrate having a cell array region and a contact region, forming a thin film structure on the substrate, including forming sacrificial film patterns isolated horizontally by a lower isolation region, the lower isolation region traversing the cell array region and the contact region, and forming sacrificial films sequentially stacked on the sacrificial film patterns, and forming an opening that penetrates the thin film structure to expose the lower isolation region of the cell array region, the opening being restrictively formed in the cell array region.

The opening may be formed to have a length that is shorter than that of the lower isolation region.

The opening may be formed to have a width that is equal to or larger than that of the lower isolation region.

Forming the thin film structure may further include forming a preliminary isolation pattern to fill the lower isolation region, and forming the opening may include removing the preliminary isolation pattern in the cell array region to form an isolation pattern in the contact region.

The preliminary isolation pattern may be formed of an insulating material having etching selectivity with respect to the sacrificial film.

The method may further include, after forming the opening, forming recessed regions by removing the sacrificial film patterns and the sacrificial films, and forming locally conductive patterns in the recessed regions.

Forming the conductive patterns may include forming a data storage film in an inner wall of the respective recessed regions, forming a conductive film to fill the opening and the recessed regions where the data storage film is formed, forming an electrode isolation region by removing the conductive film in the opening, and forming an electrode isolation pattern in the electrode isolation region.

The recessed regions may include lower recessed regions formed by removing the sacrificial film patterns and upper recessed regions formed by removing the sacrificial films, the conductive patterns filling the lower recessed regions may be isolated electrically from each other by the electrode isolation pattern and the isolation pattern, and the conductive patterns filling the upper recessed regions of the same height may be connected to each other in the contact region.

The method may further include, before forming the opening, forming semiconductor patterns that penetrate the thin film structure to be connected to the substrate.

The method may further include forming a pattern structure having a stair-step shape in the contact region by patterning the thin film structure, after forming the thin film structure, the pattern structure exposing the lower isolation region.

Another embodiment is directed to a semiconductor memory device, including a substrate having a cell array region and a contact region, lower conductive patterns on the substrate, the lower conductive patterns being electrically isolated from each other, intermediate conductive patterns sequentially stacked on the lower conductive patterns, upper conductive patterns on the intermediate conductive patterns, and semiconductor patterns that penetrate the intermediate conductive patterns to be connected to the substrate in the cell array region.

The semiconductor memory device may further include electrode isolation patterns that are spaced apart from the semiconductor patterns in the cell array region and penetrate the lower conductive patterns, the intermediate conductive patterns, and the upper conductive patterns, and an isolation pattern that is between the lower conductive patterns in the contact region to electrically isolate the lower conductive patterns from each other.

End portions of the intermediate conductive patterns may be connected to each other in an upper portion of the isolation pattern, the end portions being arranged at a same distance from the substrate.

The lower conductive patterns may be electrically isolated from each other by the electrode isolation pattern and the isolation pattern.

The isolation pattern may have a width equal to or smaller than that of a distance between the lower conductive patterns.

A distance between sidewalls of the intermediate conductive patterns and the cell array region may become smaller as a distance between the intermediate conductive pattern and the substrate becomes larger.

The semiconductor memory device may further include a data storage film interposed between the intermediate conductive patterns and the semiconductor pattern.

The data storage film may cover upper and bottom surfaces of the conductive patterns.

BRIEF DESCRIPTION OF THE DRAWINGS

The above and other features and advantages will become more apparent to those of skill in the art by describing in detail example embodiments with reference to the attached drawings, in which.

DETAILED DESCRIPTION

Figure 1:
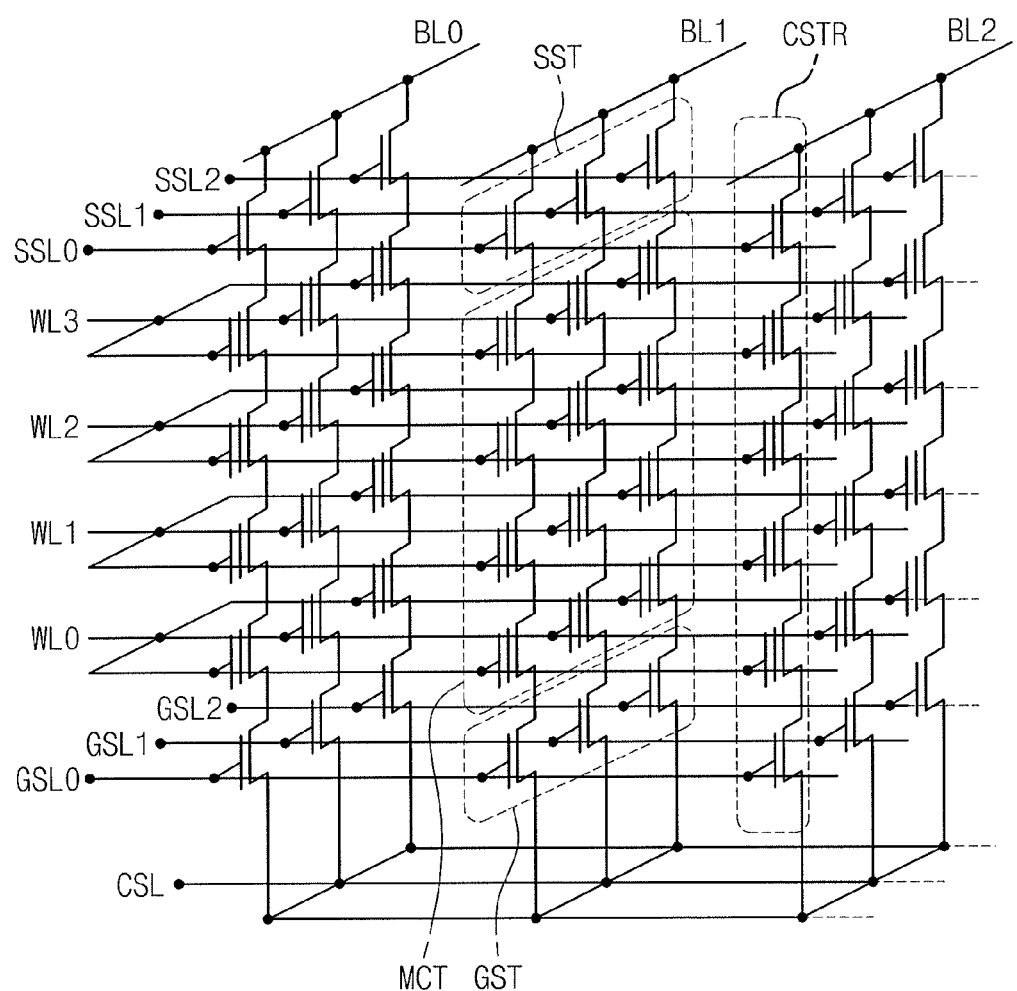
FIG. 1 illustrates a schematic circuit diagram of a three-dimensional semiconductor memory device according to an example embodiment.

Korean Patent Application No. 10-2009-0105412, filed on Nov. 3, 2009, in the Korean Intellectual Property Office, and entitled: "Three-Dimensional Semiconductor Memory Device and Method of Fabricating the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout The terminology used herein is for the purpose of describing various embodiments only and is not intended to be limiting of the embodiments. As used herein, the singular forms are intended to include the plural forms as well, unless the context clearly indicates otherwise. It will be further understood that the terms "comprises" and/or "comprising," when used in this specification, specify the presence of stated steps, operations, and/or elements but do not preclude the presence or addition of one or more other steps, operations, and/or elements.

Example embodiments may be described herein with reference to cross-sectional illustrations and/or plane illustrations that are schematic illustrations of idealized structures. Accordingly, variations from the shapes of the illustrations, as a result, for example, of manufacturing techniques and/or tolerances, are to be expected. Thus, embodiments should not be construed as limited to the shapes of regions illustrated herein, but are to include deviations in shapes that result, for example, from manufacturing. For example, an etching region illustrated as a rectangle may have rounded or curved features. Thus, the regions illustrated in the figures are schematic in nature, and their shapes are not intended to limit the actual shape of a region of a device and are not intended to limit the scope of the embodiments.

A semiconductor memory device according to an example embodiment has a three-dimensional structure.

FIG. 1 illustrates a schematic circuit diagram of a three-dimensional semiconductor memory device according to an example embodiment.

Referring to FIG. 1, the three-dimensional semiconductor memory device may include a common source line CSL, plural bit lines BL0, BL1, and BL2, and plural cell strings CSTR. The cells strings CSTR may be disposed between the common source line CSL and the bit lines BL0 to BL2.

The bit lines BL0 to BL2 may be arranged two-dimensionally. The cell strings CSTR may be connected in parallel with each of the bit lines BL0 to BL2. With such a configuration, the cell strings CSTR may be arranged two-dimensionally on the common source line CSL.

The cell strings CSTR may each include a ground selection transistor GST connected to the common source line CSL, a string selection transistor SST connected to a bit line, e.g., BL0 to BL2, and plural memory cell transistors MCT disposed between the ground selection transistor GST and the string selection transistor SST. The ground selection transistor GST, the string selection transistor SST, and the memory cell transistors MCT may be connected to each other in series. Plural ground selection lines GSL0 to GSL2, plural word lines WL0 to WL3, and plural string selection lines SSL0 to SSL2 may be disposed between the common source line CSL and the bit lines BL0 to BL2, and may be used for gate electrodes of the ground selection transistors GST, the memory cell transistors MCT, and the string selection transistors SST, respectively.

Gate electrodes of the memory cell transistors MCT arranged at a same distance from the common source line CSL may be connected to one of the word lines WL0 to WL3, so as to be in an equipotential state.

On the other hand, one cell string CSTR may include plural memory cell transistors MCT disposed at different distances from the common source line CSL. Thus, multi-filmed word lines WL0 to WL3 may be arranged between the common source line CSL and the bit lines BL0 to BL2.

The bit lines BL0 to BL2 and the string selection lines SSL0 to SSL2 may be arranged so as to intersect with each other. In this case, electric connection between predetermined cell strings and predetermined bit lines may be controlled by voltages applied to the respective bit lines BL0 to BL2 and the respective string selection lines SSL0 to SSL2. Moreover, electric connection between predetermined cell strings CSTR and the common source line CSL may be controlled by voltages applied to the respective ground selection lines GSL0 to GSL2. Thus, in order to select one cell string CSTR, voltages may selectively be applied to the bit lines BL0 to BL2, the string selection lines SSL0 to SSL2, the ground selection lines GSL0 to GSL2, and the word lines WL0 to WL3.

If a same turn-on voltage were applied to all of the ground selection lines GSL0 to GSL2 in operation of the three-dimensional memory device, all of the cell strings CSTR may electrically be connected to the common source line CSL and, consequently, a data read disturbance may increase in operation of the semiconductor memory device. According to embodiments, however, voltages may selectively be applied to the ground selection lines GSL0 to GSL2. Accordingly, embodiment may enable a reduction in data read disturbance in the selected cell string CSTR.

FIGS. 2 through 12 illustrate stages in a method fabricating a three-dimensional semiconductor memory device according to a first example embodiment.

Figure 2:
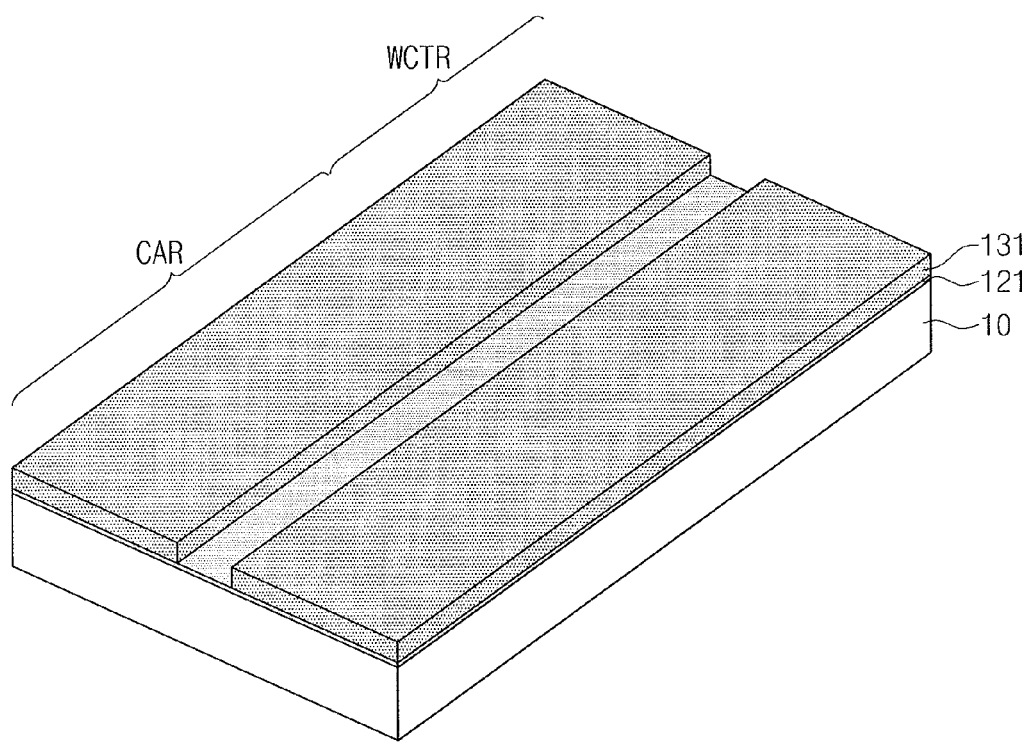
FIGS. 2 through 12 illustrate stages in a method fabricating a three-dimensional semiconductor memory device according to a first example embodiment.

Referring to FIG. 2, an insulating film 121 and sacrificial film patterns 131 may be formed on a substrate 10. The substrate 10 may include a cell array region, a peripheral circuit region, and a contact region. In FIG. 2, CAR represents a cell array region and WCTR represents a word line contact region.

The substrate 10 may be formed of a material (for example, a silicon wafer), an insulating material (for example, a glass), or a semiconductor or a conductor covered with an insulating material.

The sacrificial film patterns 131 may be formed by forming a preliminary sacrificial film on the insulating film 121 and patterning the preliminary sacrificial film. The sacrificial film patterns 131 may be formed in line shapes parallel to each other. A gap between the sacrificial film patterns 131 may be smaller than the width of the sacrificial film pattern 131.

Figure 3:
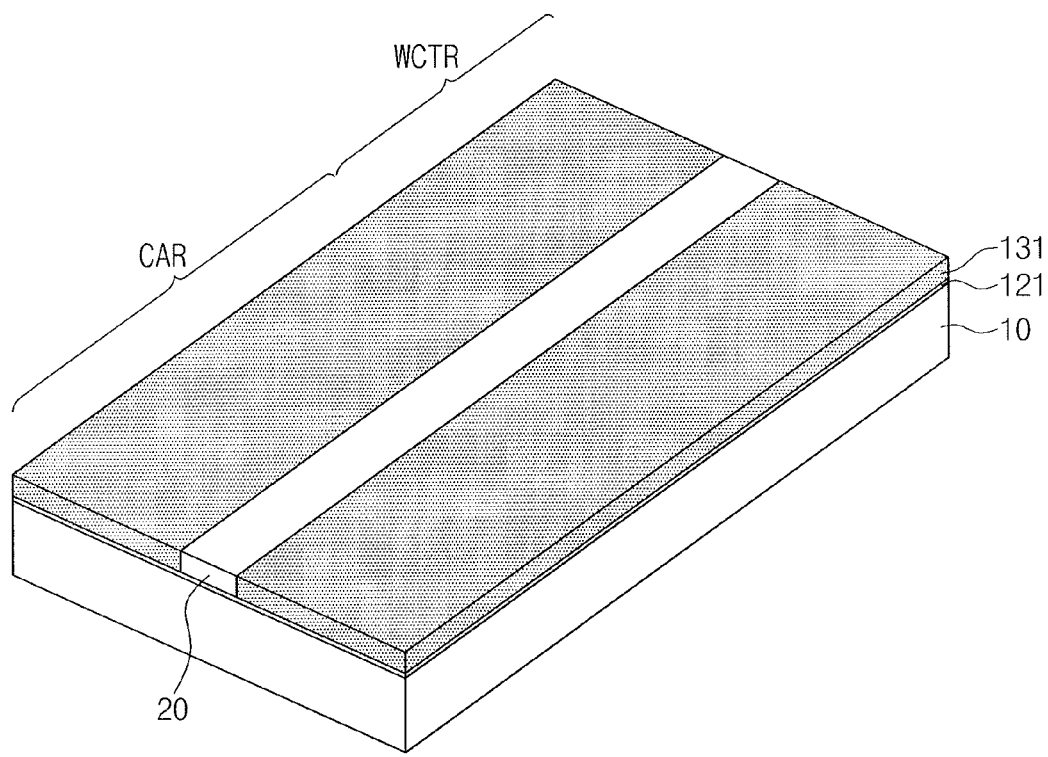

Referring to FIG. 3, a preliminary isolation pattern 20 may be formed between the sacrificial film patterns 131. The preliminary isolation pattern 20 may be an insulating film that fills the space between the sacrificial film patterns 131. The preliminary isolation pattern 20 may be formed by filling the space between the sacrificial film patterns 131 and exposing the upper surface of the sacrificial film patterns 132. The preliminary isolation pattern 20 may be formed of an insulating material having etching selectivity with respect to the sacrificial film patterns 131.

Figure 4:
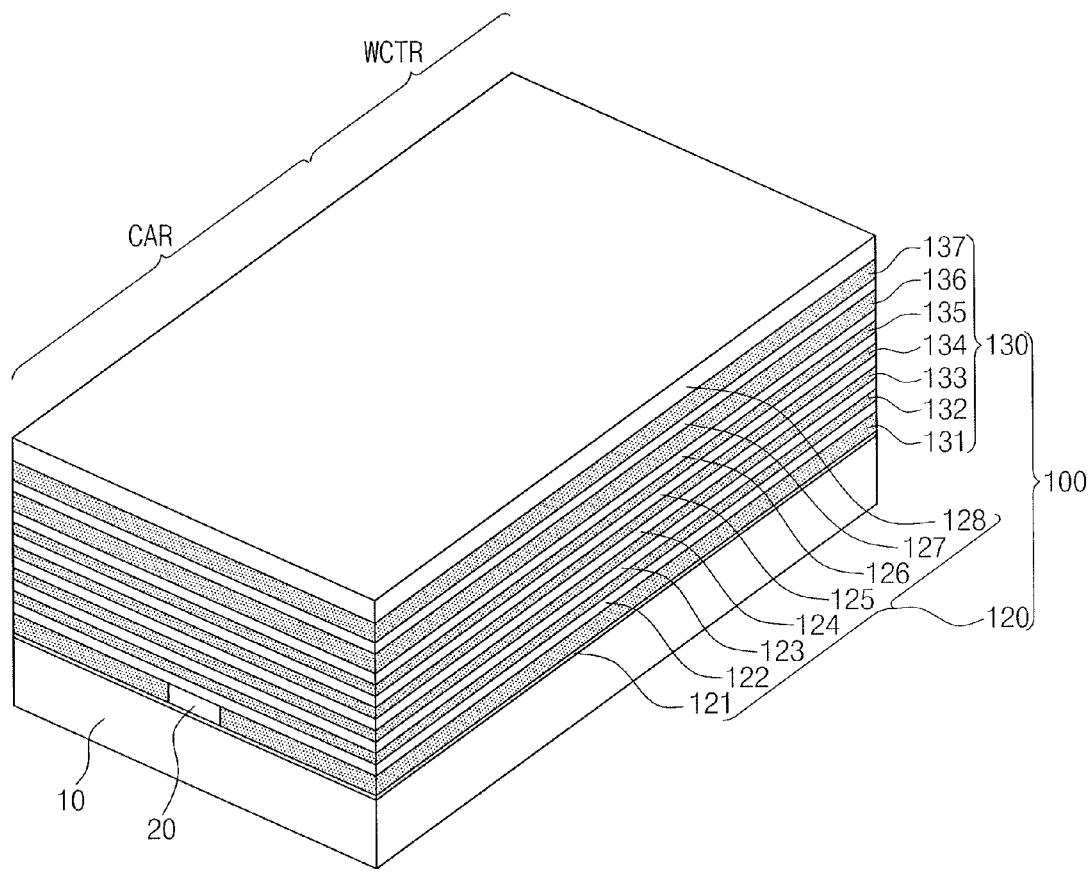

Referring to FIG. 4, additional insulating films 122 to 128 and additional sacrificial films 132 to 137 may be alternately stacked on the sacrificial film patterns 131 and the preliminary insolating pattern 20 to form a thin film structure 100.

In an implementation, the insulating film 122 may be directly formed on the upper portions of the sacrificial film patterns 131 so as to fill the space between the sacrificial film patterns 131. In this case, a part of the insulating film 122 may form the preliminary isolation pattern 20.

The method may further include forming a conductive region in the substrate 10 or on the substrate 10, before forming the thin film structure 100. When the substrate 10 is formed of a material having a semiconductor property, a conductive region may be, e.g., an impurity region formed in the substrate 10. When the substrate 10 is formed of an insulating material, the conductive region may be, e.g., a conductive film or a conductive pattern disposed on the substrate 10. According to this example embodiment, the conductive region may be used as the common source line.

The thin film structure 100 may include the plural insulating films 121 to 128 (collectively indicated with a reference numeral 120), the plural sacrificial film patterns, and the sacrificial films 131 to 137 (collectively indicated with a reference numeral 130). The insulating films 120 and the sacrificial films 130 may be stacked alternately and repeatedly, as illustrated in FIG. 4.

The insulating films 120 and the sacrificial films 130 may be formed of materials selected so as to have etching selectivity. For example, the insulating films 120 may be formed of at least one of a silicon oxide film and a silicon nitride film. The sacrificial films 130 may be formed of a material that is different from that of the insulating films 120, and may be formed of one or more of, e.g., a silicon film, a silicon oxide film, a silicon carbide film, and a silicon nitride film.

Figure 5:
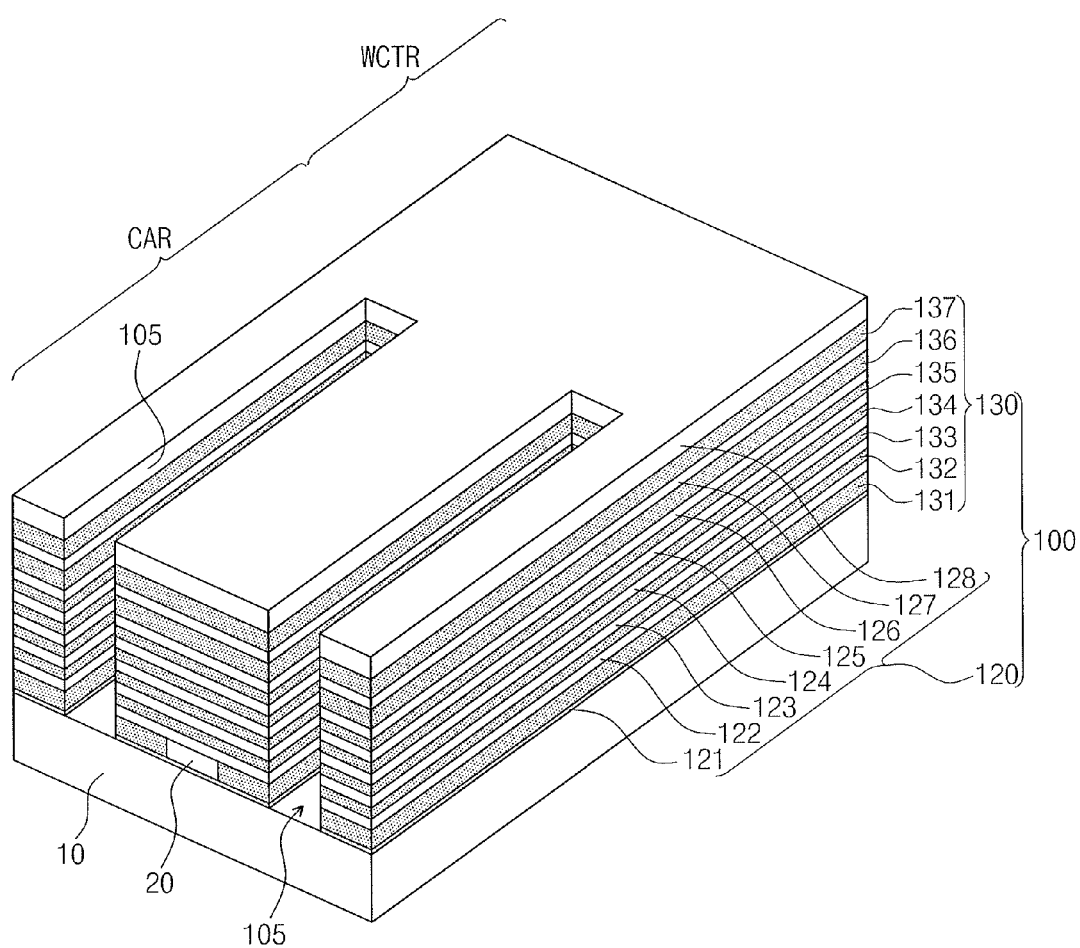
Figure 6:
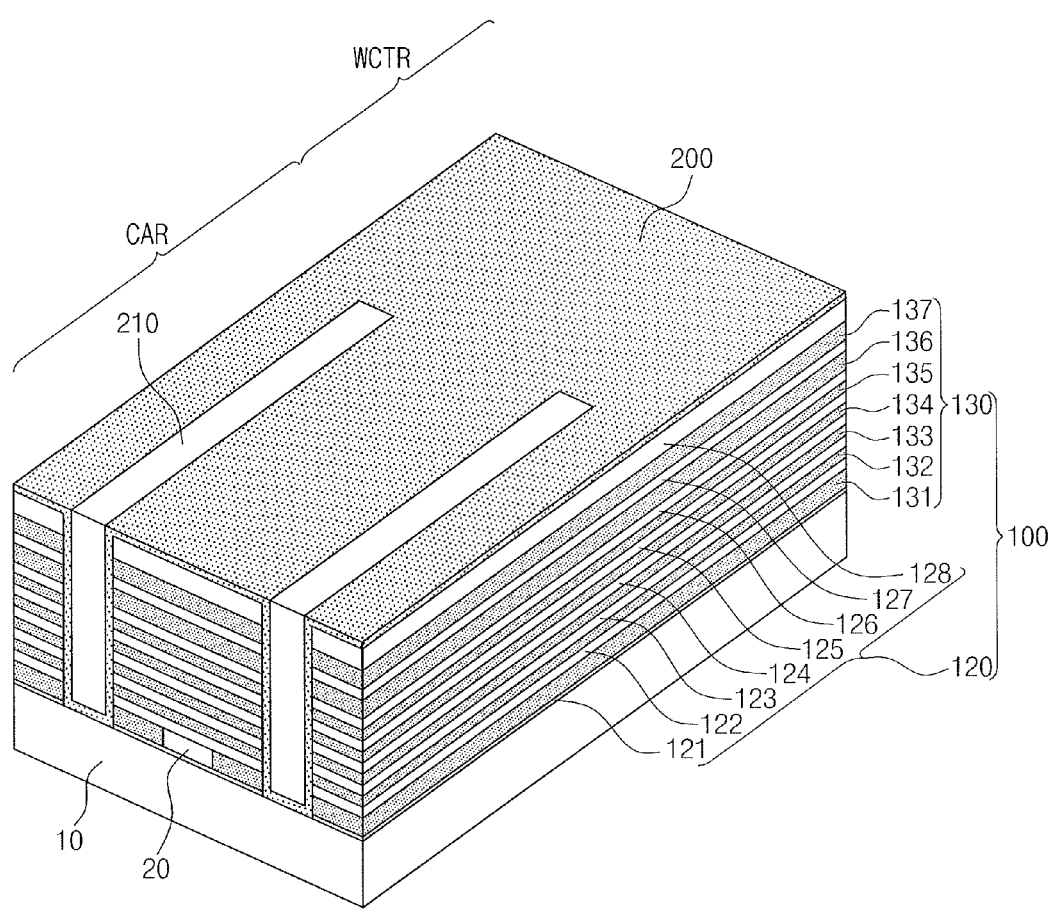
Figure 7:
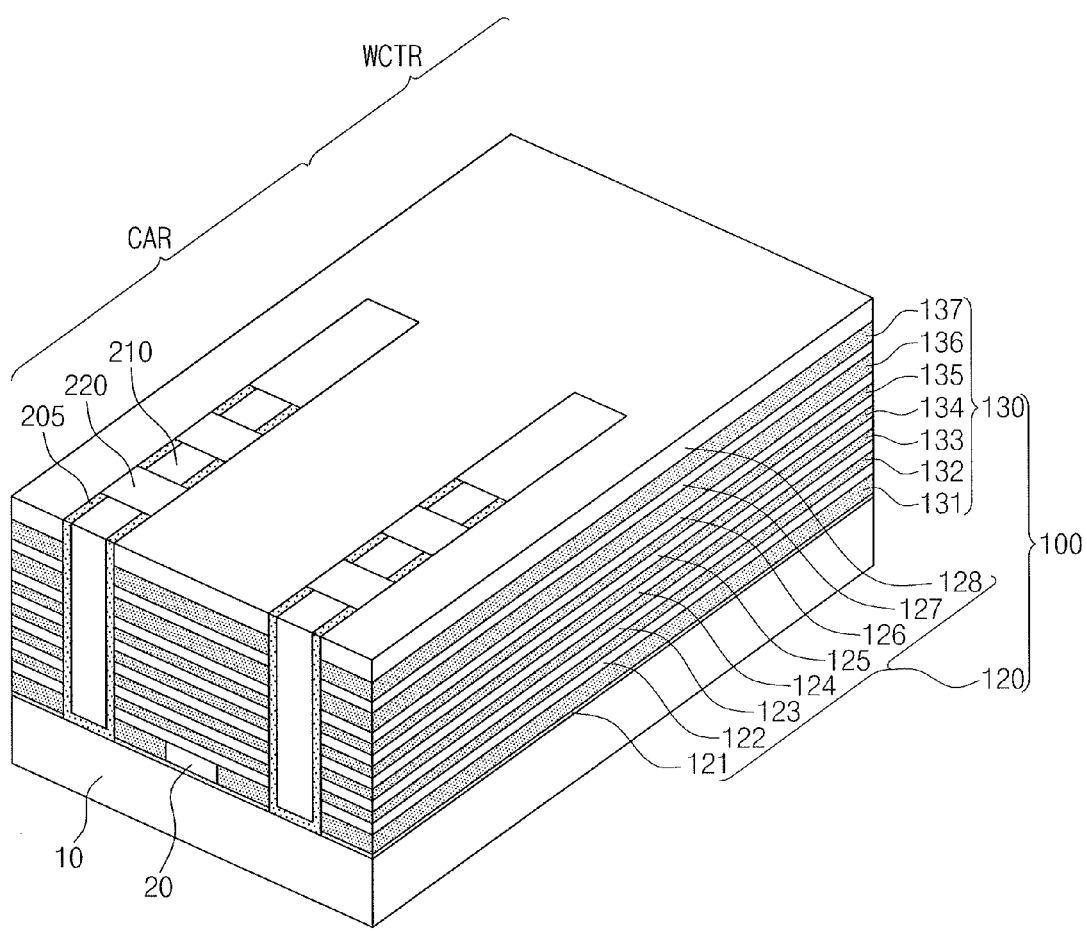

Referring to FIGS. 5 through 7, semiconductor patterns 205 (see FIG. 7) may be formed by the thin film structure 100. The forming of the semiconductor patterns 205 may include: forming openings 105 that penetrate the thin film structure 100, as illustrated in FIG. 5; forming a semiconductor film 200 and first buried patterns 210 sequentially filling the openings 105, as illustrated in FIG. 6; and patterning the semiconductor film 200, as illustrated in FIG. 7.

Further to the above, the openings 105 may be formed to expose the upper surface of the substrate 10 or the conductive region. Thus, the semiconductor film 200 (see FIG. 6) may be formed so as to come into direct contact with the upper surface of the substrate 10 or the conductive region.

The horizontal cross-sections of the openings 105 may have a rectangle shape with an aspect ratio of, e.g., 10 or more. In other embodiments, the horizontal cross-sections of the openings 105 may be formed in a circular cylindrical shape or an elliptical cylindrical shape two-dimensionally.

In an implementation, the semiconductor film 200 may have a polycrystalline structure, a single-crystal structure, or an amorphous crystal structure, may be a semiconductor material, and may be formed by, e.g., an epitaxial method or chemical vapor deposition. In an implementation, the semiconductor film 200 may be formed of a semiconductor material (for example, polysilicon) with a polycrystalline structure, and may be formed by, e.g., chemical vapor deposition. In this case, the semiconductor film 200 may be formed to cover the inner walls of the openings 105 substantially conformally.

Referring to FIG. 6, the first buried patterns 210 may be formed to fill the openings 105 (in which the semiconductor film 200 is formed) and may contain at least one insulating material. For example, the first buried patterns 210 may be a silicon oxide film or insulating materials formed by a SOG method.

According to an embodiment, hydrogen annealing may further be performed to process the resultant product in which the semiconductor film 200 is formed under a gas ambient containing hydrogen or heavy hydrogen (deuterium). In the hydrogen annealing, crystal defects that may be present in the semiconductor film 200 may be cured.

Referring to FIG. 7, second buried patterns 220 may be formed so as to fill the spaces between the semiconductor patterns 205, after the plural semiconductor patterns 205 isolated from each other in the openings 105 are formed by patterning the semiconductor film 200.

For example, the forming of the semiconductor patterns 205 may include: exposing the inner wall of the semiconductor film 200 by patterning the first buried patterns 210 by use of etching mask patterns crossing the long axis of the openings 105, and isolating the semiconductor patterns 205 horizontally by etching the inner wall of the exposed semiconductor film 200.

The second buried patterns 220 may be formed of at least one insulating material. The forming of the second buried patterns 220 may include: forming a second buried film so as to fill the spaces between the isolated semiconductor patterns 205, and patterning the second buried film and the semiconductor patterns 205 by etching until the upper surface of the thin film structure 100 is exposed. In this case, the semiconductor patterns 205 may be node-isolated to be locally formed in the openings 105 and the second buried patterns 220.

Figure 8:
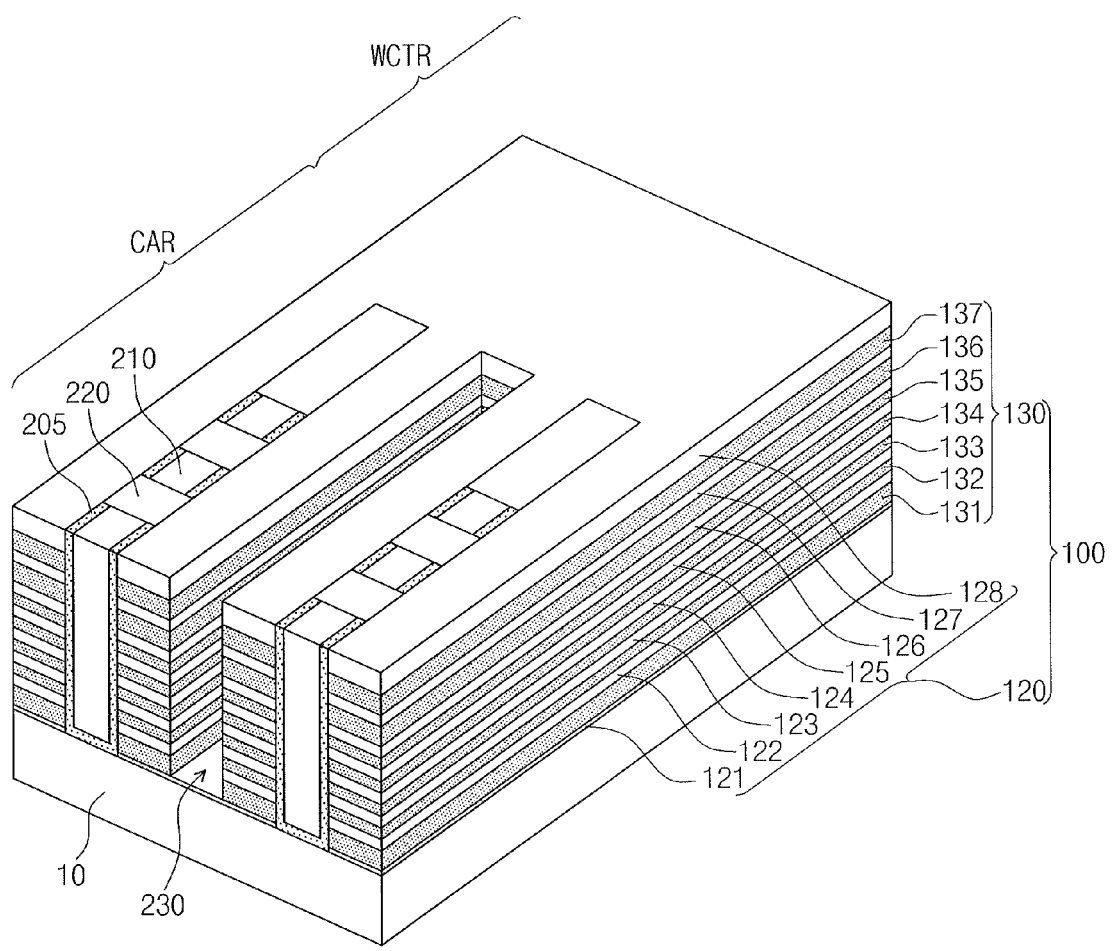
Figure 9:
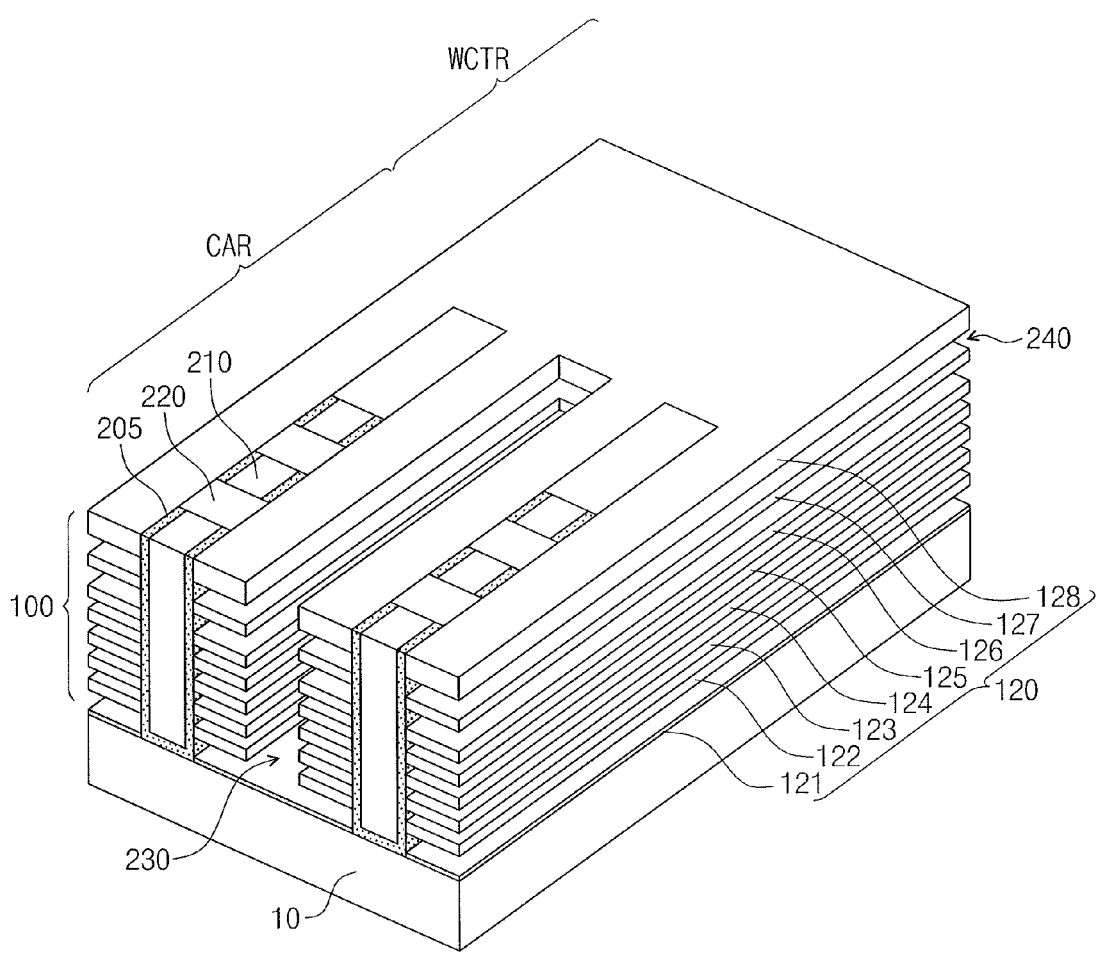
Figure 10:
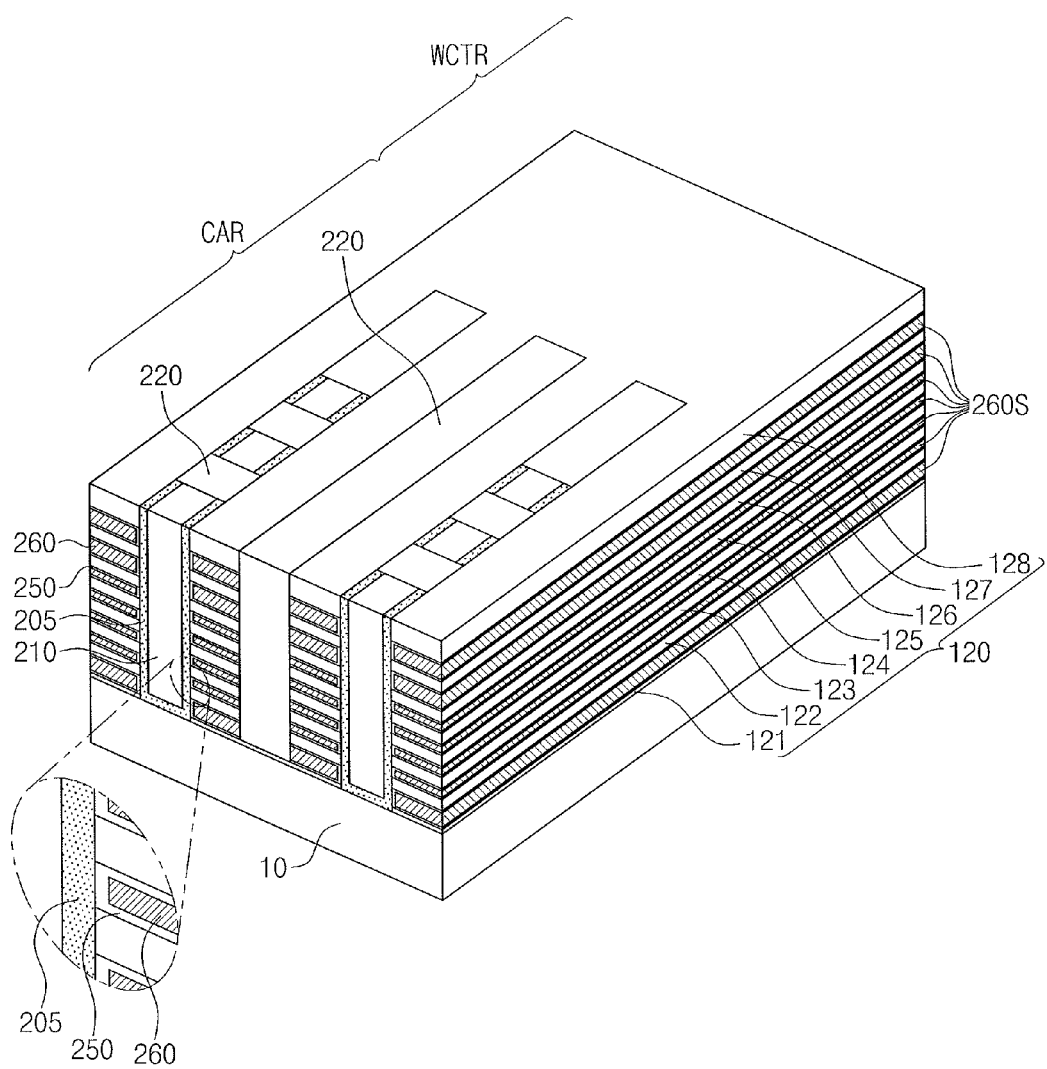

Referring to FIGS. 8 to 10, a horizontal wiring forming process may be performed to form conductive patterns 260 (see FIG. 10) that are sequentially stacked and face the sidewalls of the semiconductor patterns 205.

For example, forming the horizontal wiring may include: forming a trench or trenches 230 that penetrates parts or the whole of thin films forming the thin film structure 100 between the semiconductor patterns 205; and replacing the sacrificial films of the thin film structure 100 with conductive material films.

Further to the above, as illustrated in FIG. 8, the trench(es) 230 may be formed so as to be spaced apart from the semiconductor patterns 205 and expose the sidewalls of the sacrificial films 130 and the insulating films 120. The horizontal shape of the trench(es) 230 may be, e.g., a line shape or a rectangular shape. The trench(es) 230 may be formed so as to vertically expose at least the upper surface of the lowermost film (e.g., sacrificial film 131) of the sacrificial films 130.

According to another embodiment, the trenches 230 may expose a part of the surface of the substrate 10 of the cell array region CAR. For example, in forming the trenches 230, a part of the preliminary isolation pattern 20 disposed in the lowermost film may be etched therewith. Accordingly, the sidewalls of the sacrificial film patterns 131 may be exposed and an isolation pattern 25 (see FIG. 12) may be formed in a word line contact region WCTR. The isolation pattern 25 may be formed between the sacrificial film patterns 131 in the word line contact region WCTR. In forming the trenches 230, the width of the trenches 230 may be equal to or larger than the width of the preliminary isolation pattern 20.

In another embodiment, a conductive region (not shown) usable as the common source line may be locally formed in the substrate 10 of the lower portions of the trenches 230. The conductive region may be formed by an ion implanting process of using the thin film structure 100, in which the trenches 230 are formed, as an ion mask.

Referring to FIGS. 9 and 10, replacing the sacrificial films may include: forming recessed regions 240 between the insulating films 120 by selectively removing the sacrificial films 130 of which the wide walls are exposed by the trenches 230, as illustrated in FIG. 9; and forming a data storage film 250 and a conductive pattern 260 within each of the recessed regions 240, as illustrated in FIG. 10.

The recessed regions 240 may be gap regions horizontally extending from the trenches 230 in the spaces between the insulating films 120, and may be formed so as to expose the sidewalls of the semiconductor patterns 205. The forming of the recessed regions 240 may include isotropically etching the sacrificial films 130 by use of an etching recipe having etching selectivity with respect to the insulating films 120. For example, when the sacrificial films 130 are formed of a silicon nitride film and the insulating films 120 are formed of a silicon oxide film, the etching may be performed using an etchant that contains phosphoric acid.

Forming the data storage film 250 and the conductive patterns 260 may include: forming the data storage film 250 and the conductive film to sequentially cover the trenches 230 and the recessed regions 240; and removing the conductive film in the trenches 230 to remain the conductive patterns 260 in the recessed regions 240. Subsequently, as illustrated in FIG. 10, an electrode isolation pattern 265 may further be formed to fill the trench 230.

Further to the above, the data storage film 250 may be formed by a deposition method (for example, chemical vapor deposition or atomic film deposition) providing excellent step coverage. The data storage film 250 may have a thickness thinner than the half of the thickness of the recessed region 240. The data storage film 250 may be formed so as to conformally cover the resultant product in which the recessed region 240 is formed.

In a flash memory according to this embodiment, the data storage film 250 may contain a charge storage film. For example, the data storage film 250 may contain a trap insulating film, a floating gate electrode, an insulating film containing conductive nanodots, etc. According to this embodiment, the data storage film 250 may further include a tunnel insulating film and a blocking insulating film. The tunnel insulating film may include at least one of a silicon oxide film and a silicon nitride film. The blocking insulating film may include at least one of an aluminum oxide film, a silicon oxide film, and a silicon nitride film.

The conductive film may be formed so as to fill the recessed regions 240 and the trenches 230 covered with the data storage film 250. The conductive film may include at least one of a doped silicon film, a tungsten film, a metal nitride film, a metal silicide film.

Removing the conductive film in the trenches 230 may include performing anisotropic etching on the conductive film by using the uppermost insulating film (e.g., insulating film 128) of the thin film structure 100, or by using a hard mask pattern (not illustrated) further formed on the uppermost insulating film, as an etching mask. When the conductive film is removed from the trench 230, the conductive film forms the conductive patterns 260 that are vertically isolated. Thus, the conductive patterns 260 may locally be formed in the recessed regions 240 and may constitute a horizontal wiring structure 260S.

Referring to FIG. 10, forming the electrode isolation pattern 265 may include filling the trench 230 (from which the conductive film is removed) with at least one insulating material. According to this embodiment, the electrode isolation pattern 265 may be formed of at least one of a silicon oxide film, a silicon nitride film, and a silicon oxynitride film.

Figure 11:
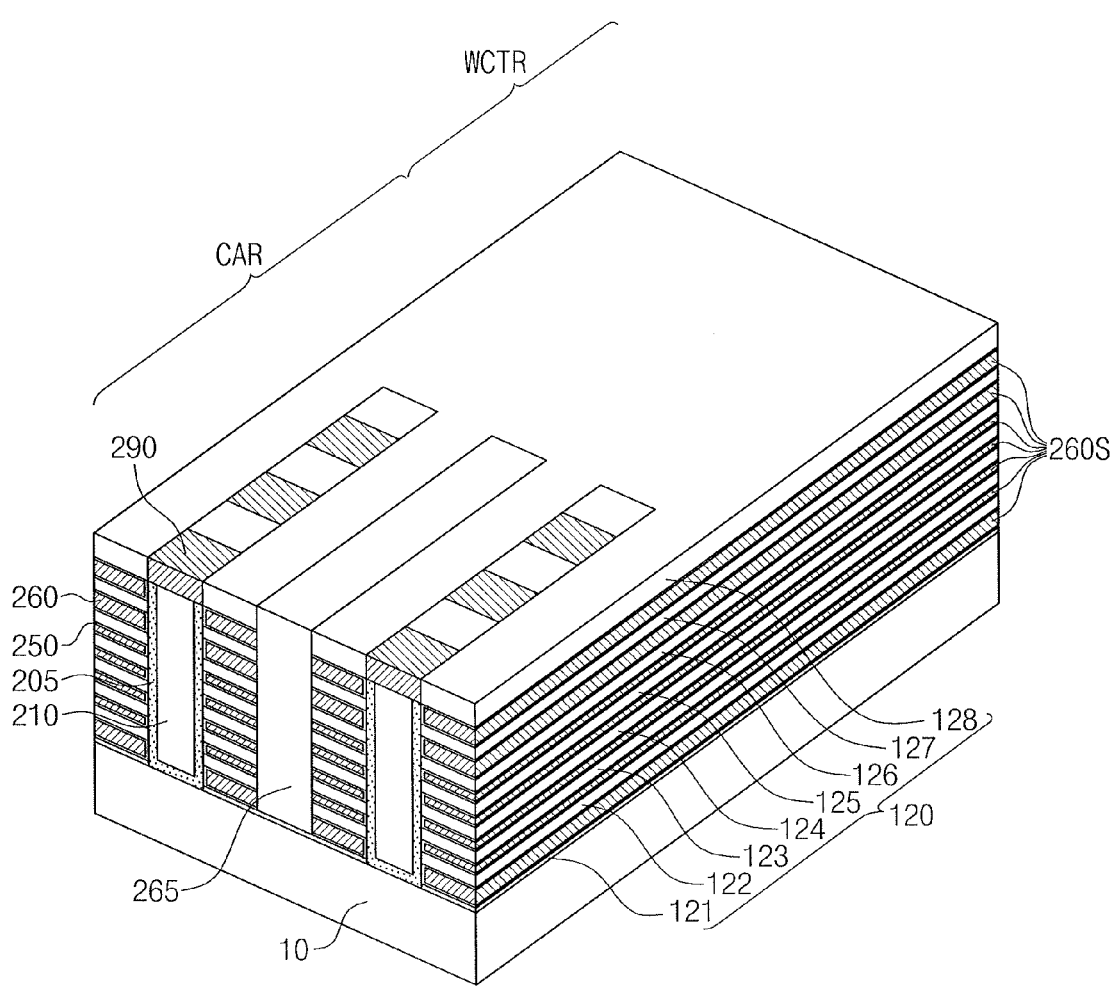

Referring to FIG. 11, a contact pad 290 may be formed on the upper regions of the first buried pattern 210 and the semiconductor pattern 205.

Figure 12:
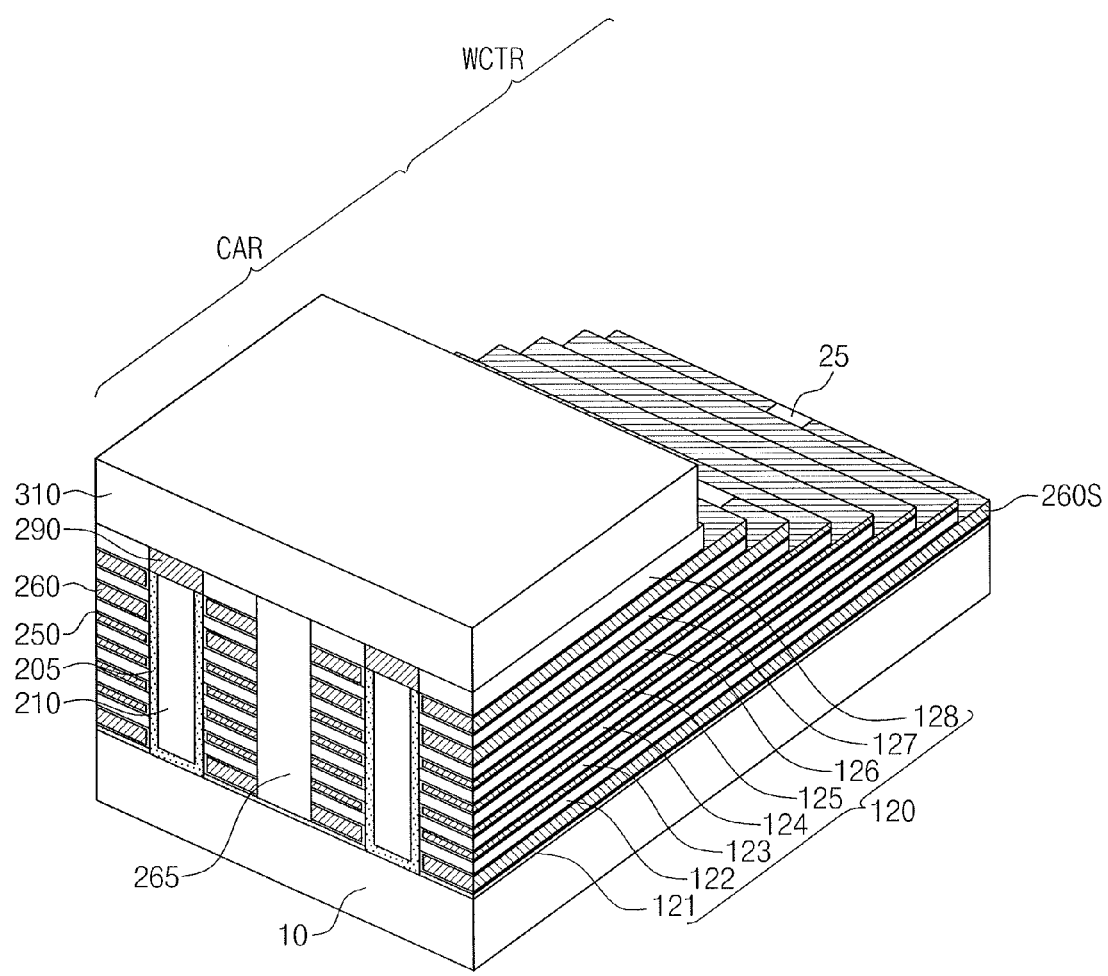

Referring to FIG. 12, the horizontal wiring structure 260S may be patterned to form a contact region with a step shape in the word line contact region WCTR. This process may include forming a sacrificial mask pattern 310 on the horizontal wiring structure 260S, and forming the contact region with a step shape by patterning the horizontal wiring structure 260S.

Further to the above, the sacrificial mask pattern 310 may be formed of a material with etching selectivity with respect to the materials of the insulating films 120 and the horizontal wiring structure 260S. According to this embodiment, the sacrificial mask pattern 310 may be formed of one of organic materials or one of photoresist materials. The thickness of the sacrificial mask pattern 310 may be larger than the area of the contact region.

Patterning the horizontal wiring structure 260S may include exhaustive etching performed using the sacrificial mask pattern 310 as an exhaustive etching mask. Specifically, the exhaustive etching may include a plurality of sub-patterning processes, and each of the plurality of sub-patterning processes may include horizontal etching and vertical etching.

The horizontal etching may be performed so that the occupying area of the sacrificial mask pattern 310 is gradually reduced and may include etching the sidewall of the sacrificial mask pattern 310 horizontally. In the horizontal etching, by horizontally expanding the region exposed by the sacrificial mask pattern 310, it is possible to newly expose a part of the upper surface of the horizontal wiring structure 260S covered with the sacrificial mask pattern 310 in the previous sub-patterning process. Thus, the area of the exposed insulating films 120 and the exposed horizontal wiring structure 260S may be expanded, as the sub-patterning process is repeatedly performed.

The horizontal etching may be performed by isotropic dry etching, or may be performed by wet etching. Moreover, the upper surface of the sacrificial mask pattern 310 may be etched together with the sidewall of the sacrificial mask pattern by performing slimming in the horizontal etching. Accordingly, the width and thickness of the sacrificial mask pattern 310 may be reduced, as the sub-patterning process is repeatedly performed.

The vertical etching may include etching the horizontal wiring structure 260S and the insulating films 120 using the sacrificial mask pattern 310 as an etching mask. The vertical etching may be performed so that one of the conductive patterns 260 and one of the insulating films 120 are vertically removed in the sub-patterning process. As for the horizontal range in the vertical etching, the regions of the horizontal wiring structure 260S and the insulating films 120 etched in the vertical etching are located below mask patterns 301 and 302 removed in the corresponding sub-patterning process and the previously performed sub-patterning process. Thus, the horizontal wiring structure 260S and the insulating film 120 patterned in the previous sub-patterning process may further be patterned during predetermined sub-patterning process.

The cumulative number of times of performing the sub-patterning processes on the horizontal wiring structure 260S may be different depending on a distance from a cell array region CAR or the semiconductor patterns 205. In accordance with the difference in the cumulative number of times of the sub-patterning processes, the horizontal wiring structure 260S may be formed so as to have a stair-step shape in the word line contact region WCTR, as illustrated in FIG. 12. The upper surface of the isolation pattern 25 may be exposed between the lowermost conductive patterns in the horizontal wiring structure 260S with the stair-step shape in the word line contact region WCTR.

Figure 13:
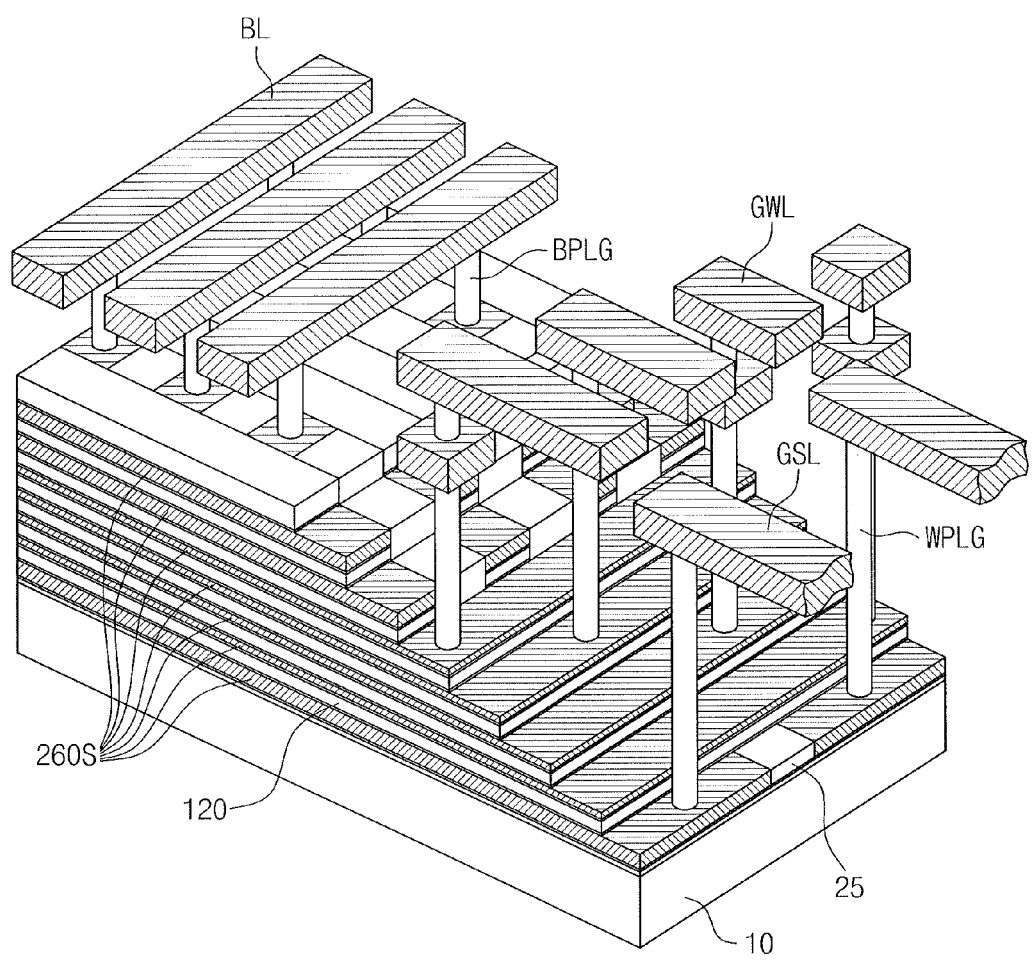
FIGS. 13 and 14 illustrate varying perspective views of a three-dimensional semiconductor memory device according to the first example embodiment.
Figure 14:
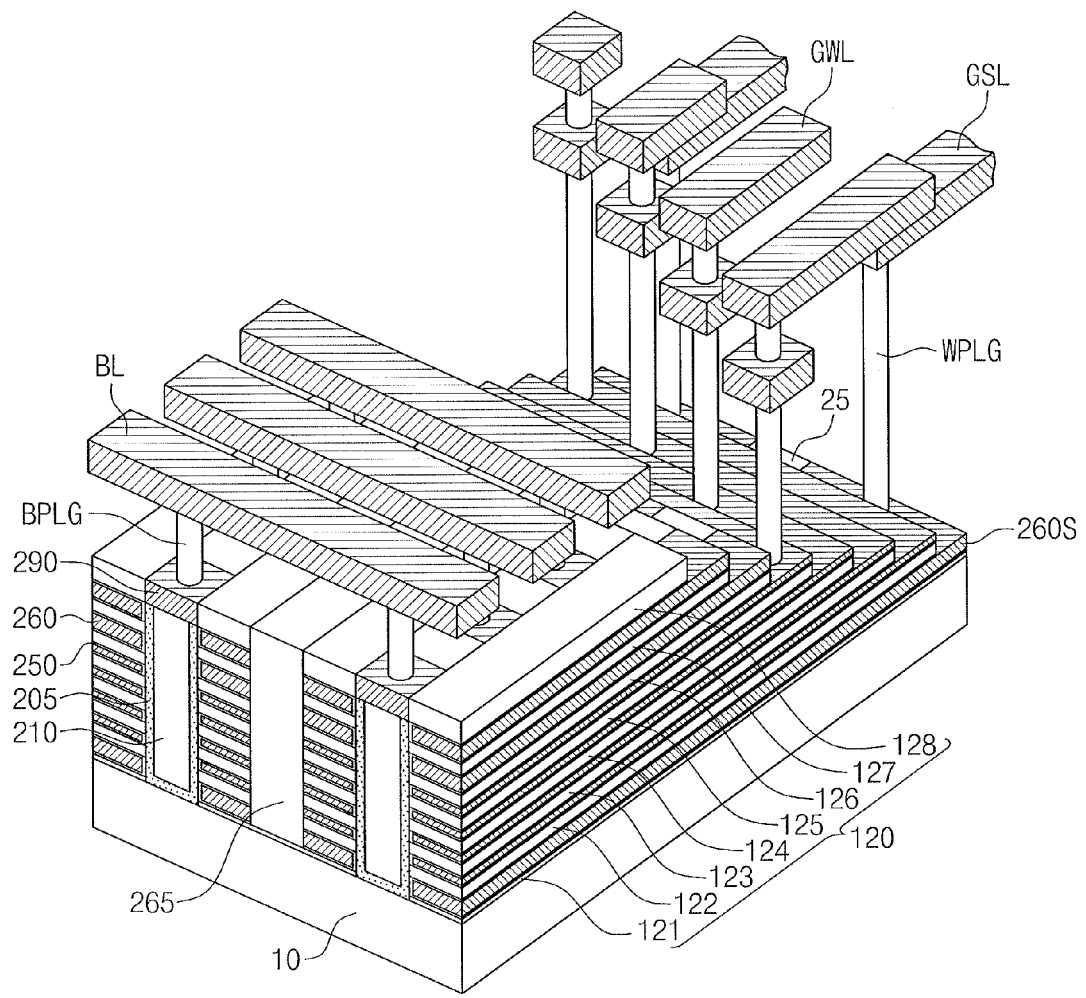

FIGS. 13 and 14 illustrate varying perspective views of a three-dimensional semiconductor memory device according to the first example embodiment, as viewed from different directions.

Referring to FIGS. 13 and 14, the sacrificial mask pattern 310 is removed, and then word line plugs WPLG are formed to be connected to the horizontal hire structure 260S and global word lines GWL are formed to be connected to the word line plugs WPLG.

As described above, the horizontal wiring structure 260S may have a stair-step shape in the word line contact region WCTR. Therefore, the conductive patterns 260 formed with different heights may be connected respectively to the word line plugs WPLG formed in the same process. On the other hand, the conductive patterns 260 located in the lowermost film and spaced apart from each other may be connected to the ground selection lines GSL via the word line plugs WPLG.

Bit line plugs BPLG may further be formed to be connected to the semiconductor patterns 205, and bit lines BL may further be formed to be connected to the bit line plugs BPLG. The bit lines BL may be formed in a direction traversing the trenches 230 and the conductive patterns 260, as illustrated in FIGS. 13 and 14. According to this embodiment, the bit line plugs BPLG may be formed by the process of forming the word line plugs WPLG. Similarly, the bit lines BL may be formed by the process of forming the global word lines GWL.

According to this embodiment, the stacked conductive patterns 260 may be used as the string selection line SSL, the ground selection line GSL, and the word lines WL that are described above with reference to FIG. 1. For example, the uppermost film and the lowermost film of the conductive patterns 260 may be used as the string selection line SSL and the ground selection line GSL, respectively. The conductive patterns 260 between the uppermost film and the lowermost film may be used as the word lines WL.

In another implementation, as illustrated in FIGS. 13 and 14, the two conductive patterns 260 arranged in the uppermost films may be used as the string selection line SSL. The conductive patterns 260 used as the string selection line SSL may be isolated horizontally. In this case, the plural string selection lines SSL isolated electrically may be arranged at the same height.

In another implementation, the word lines WL included in one block may be connected to each other in the word line contact region WCTR to form a comb shape or a finger shape. Thus, the end portions of the word lines WL arranged at the same height from the substrate 10 may be connected to each other in the upper portion of the isolation pattern 25 formed in the word line contact region WCTR.

The conductive patterns 260 of the lowermost film used as the ground selection line GSL may be isolated horizontally. Thus, the conductive patterns 260 of the lowermost film may be isolated electrically from the electrode isolation pattern 265 of the cell array region CAR by the isolation pattern 25 of the word line contact region WCTR. The ground selection lines GSL are isolated electrically from each other. Thus, voltages may selectively be applied to the respective ground selection lines GSL.

FIGS. 15 through 20 illustrate stages in a method of fabricating a three-dimensional semiconductor memory device according to a second example embodiment. The descriptions of same technical features as those of the above-described first embodiment may not be repeated, for clarity.

Comparing the first embodiment to second embodiment, the fabricating method according to the second embodiment is different in fabricating order, in that the series of processes of forming the horizontal wiring structure 260S may be performed after the series of processes of forming the stair-step shape structure.

Referring to FIGS. 15 through 20, the thin film structure 100 is formed, and then the semiconductor patterns 205 are formed by the thin film structure 100. The thin film structure 100 may include the plural insulating films 121 to 128 (indicated with the reference numeral 120) and the plural sacrificial patterns 131 to 137 (indicated with the reference numeral 130), and may be formed in the same way as that described in the first embodiment with reference to FIGS. 2 through 4.

Figure 15:
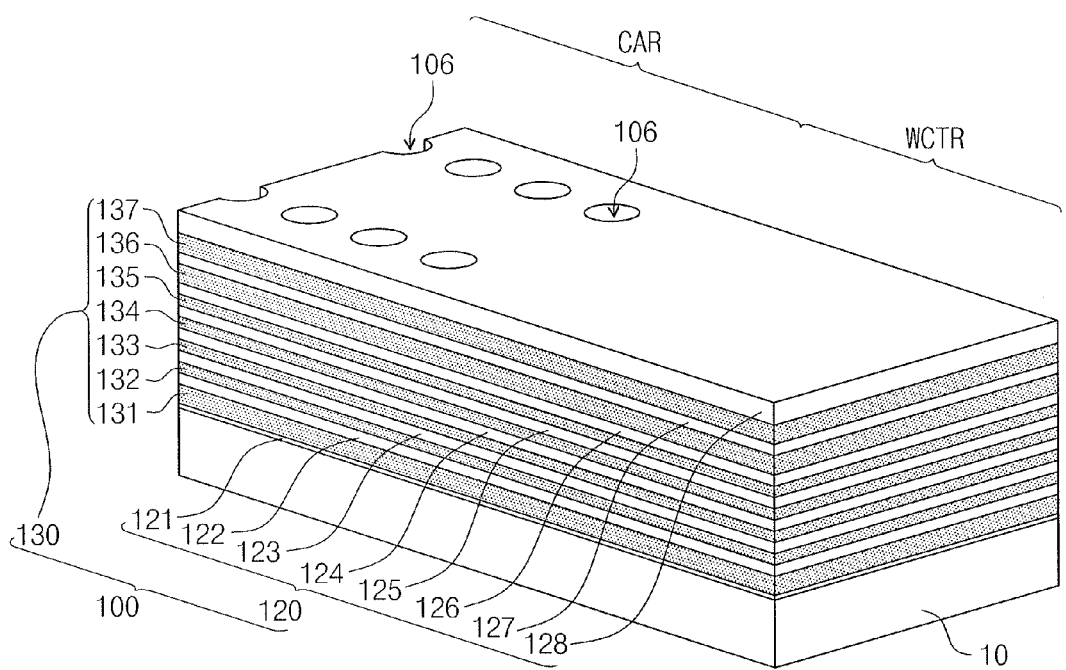
FIGS. 15 through 20 illustrate stages in a method of fabricating a three-dimensional semiconductor memory device according to a second example embodiment.
Figure 16:
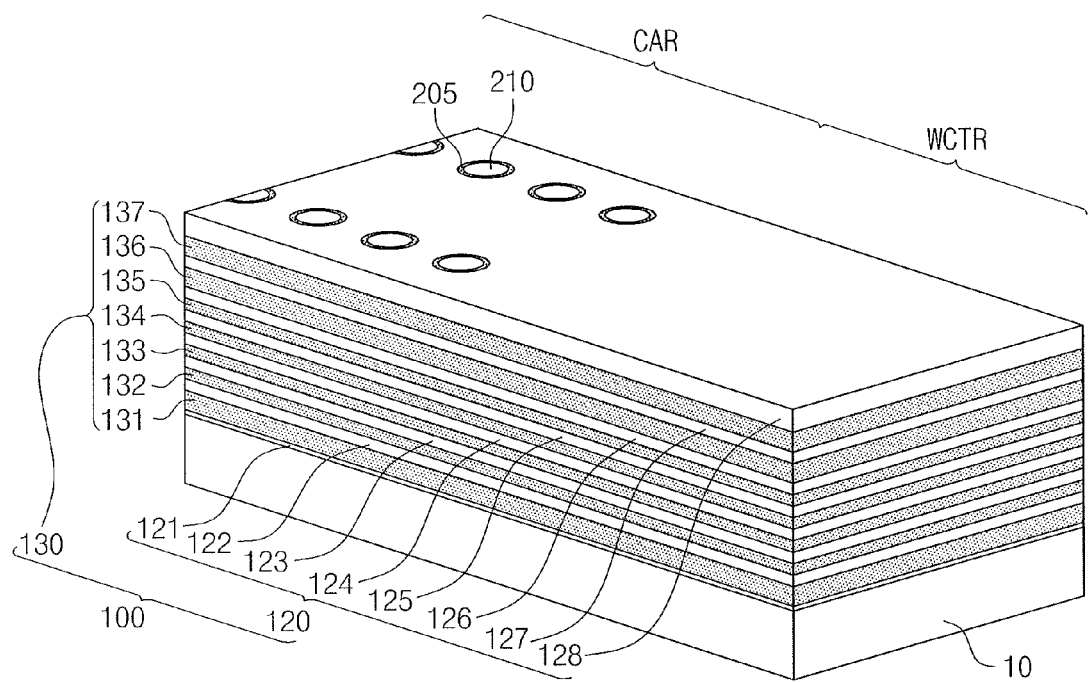

Referring to FIGS. 15 and 16, forming the semiconductor pads 205 may include: forming through-holes 106 that penetrate the thin film structure 100, as illustrated in FIG. 15; and forming the semiconductor pads 205 and the first buried patterns 210 sequentially filling the through-holes 106, as illustrated in FIG. 16.

Further to the above, as illustrated in FIG. 15, the through-holes 106 according to this embodiment may be formed in a hole shape, as compared to the line shape illustrated in FIG. 5. The semiconductor pads 205 and the first buried patterns 210 may be formed by a damascene process by using the through-holes 106 as a mold. Accordingly, the bottom surface of the semiconductor patterns 205 according to this embodiment may be formed in a closed cylindrical shape or a cup shape. The materials of the semiconductor patterns 205 and the first buried patterns 210 may be the same as those in the first embodiment.

Figure 17:
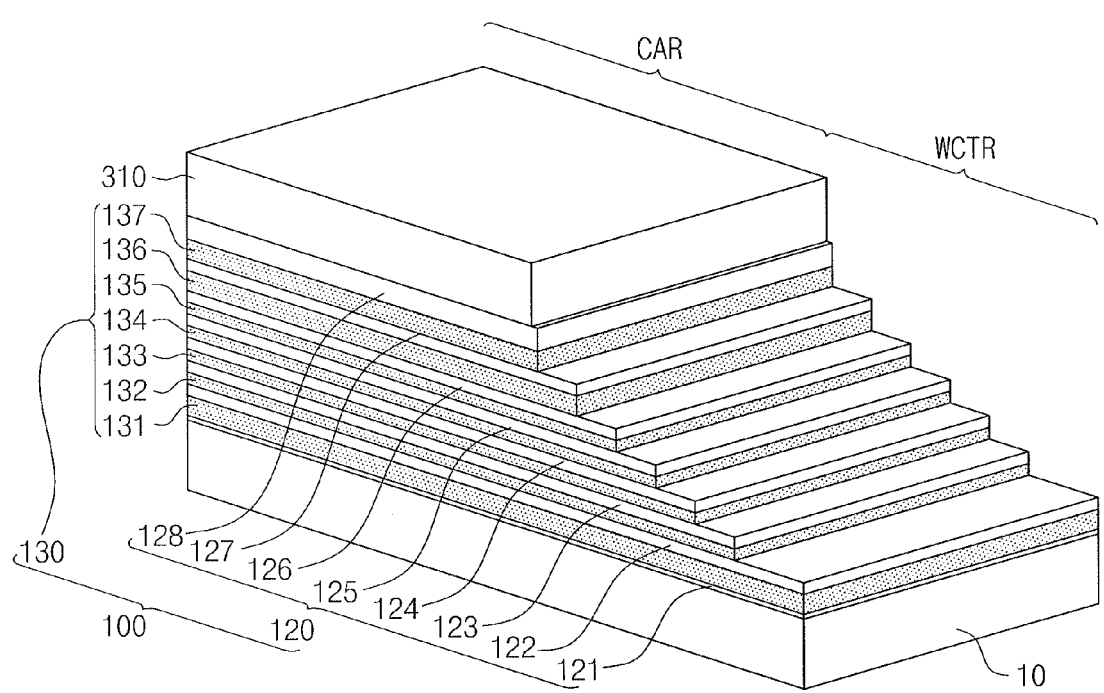

Referring to FIG. 17, the sacrificial mask pattern 310 may be formed on the thin film structure 100. The sacrificial mask pattern 310 described above in connection with the first embodiment may be formed on the resultant product in which the horizontal wiring structure 260S is formed. In comparison, according to this embodiment, a mask structure 300S may be formed on the thin film structure 100 including the sacrificial films 130.

The sacrificial mask pattern 310 according to this embodiment may be formed in the same way as in the first embodiment. However, since the above-described fabricating order according to the first embodiment may be different from the fabricating order according to this embodiment, the two embodiments may be different in the material that is etched in the exhaustive etching by using the mask structure 300S as an etching mask. That is, according to the first embodiment, the exhaustive etching may include the etching of the conductive patterns 260. By comparison, according to the second embodiment, the exhaustive etching may include etching the sacrificial films 130 forming the thin film structure 100.

With further regard to the present embodiment, after the sacrificial mask pattern 310 is formed on the thin film structure 100, the exhaustive etching may be performed using the sacrificial mask pattern 310 as an exhaustive etching mask. The exhaustive etching may include a plurality of sub-patterning processes, and each of the plurality of sub-patterning processes may include horizontal etching and vertical etching. The sacrificial mask pattern 310 may be formed by the same way and the same material as in the above-described first embodiment.

The horizontal etching may be performed so that the occupying area of the sacrificial mask pattern 310 is gradually reduced, and may include etching the sidewall of the sacrificial mask pattern 310 horizontally, as in the above-described first embodiment.

The vertical etching may include etching the insulating films 120 and the sacrificial films 130 by using the sacrificial mask pattern 310 as an etching mask. The vertical etching may be performed so that one of the sacrificial films 130 and one of the insulating films 120 are vertically removed in the sub-patterning process. Moreover, the sacrificial films 130 and the insulating films 120 patterned in the previous patterning process may further be patterned during predetermined sub-patterning process.

The cumulative number of times of the sub-patterning processes on the thin film structure 100 may be different depending on a distance from the cell array region CAR or the semiconductor patterns 205. In accordance with the difference in the cumulative number of times of the sub-patterning processes, the thin film structure 100 may be formed so as to have a stair-step shape in the word line contact region WCTR, as illustrated in FIG. 17.

Figure 18:
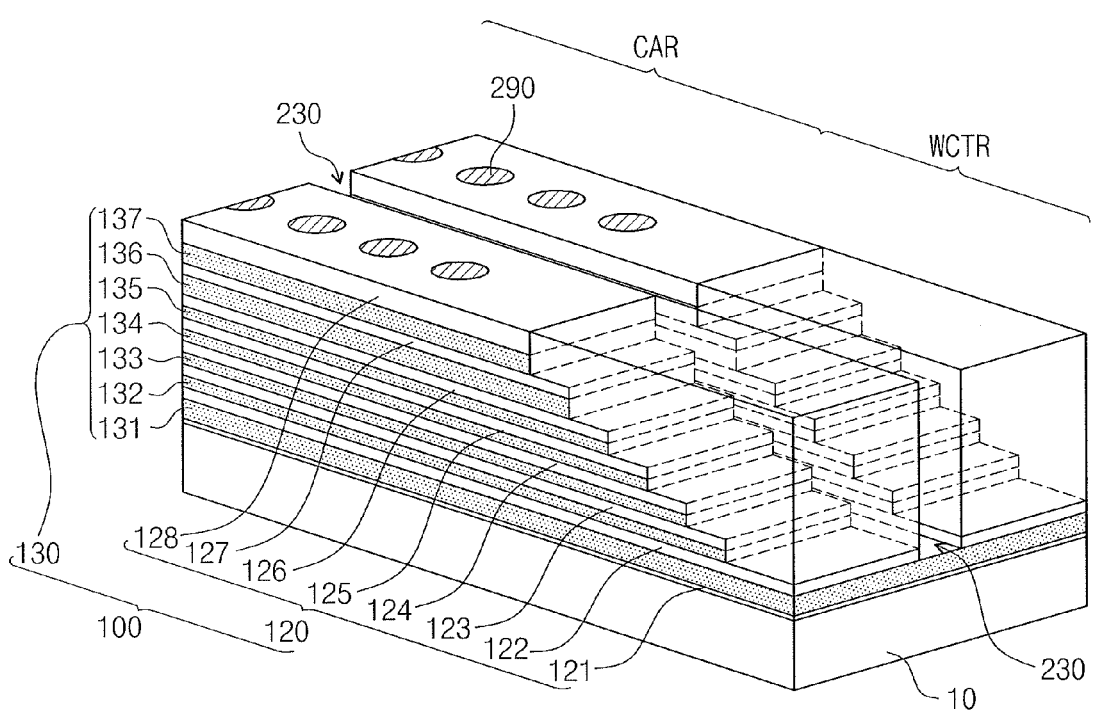
Figure 19:
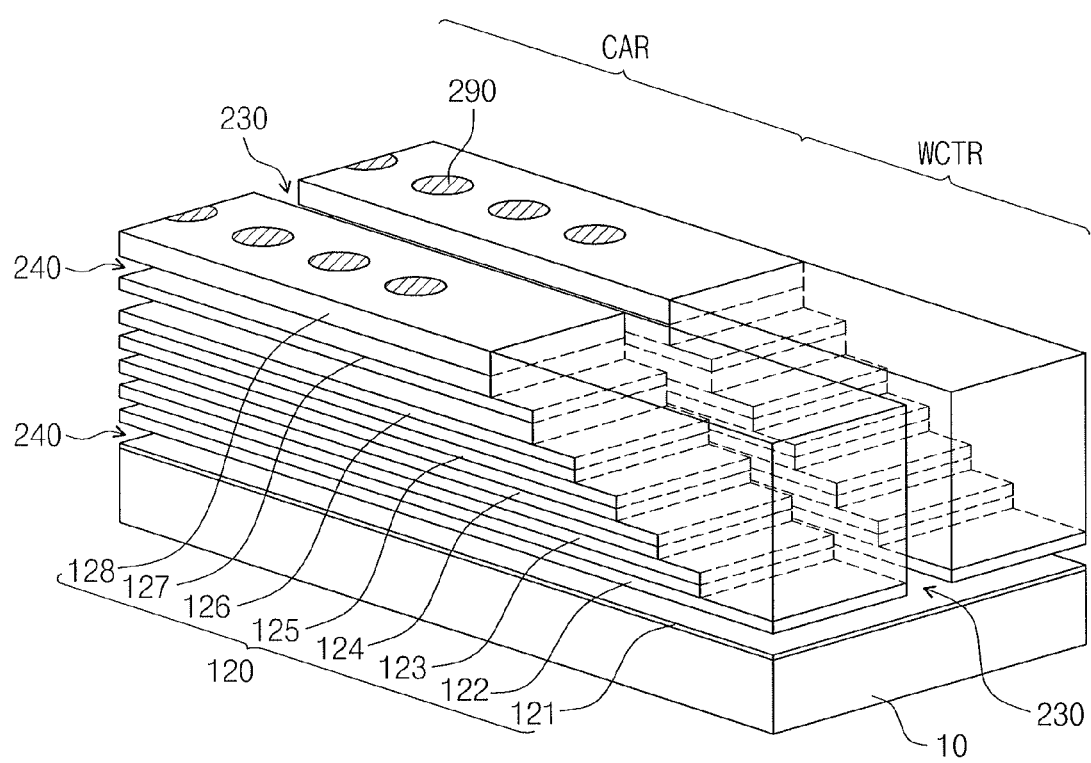
Figure 20:
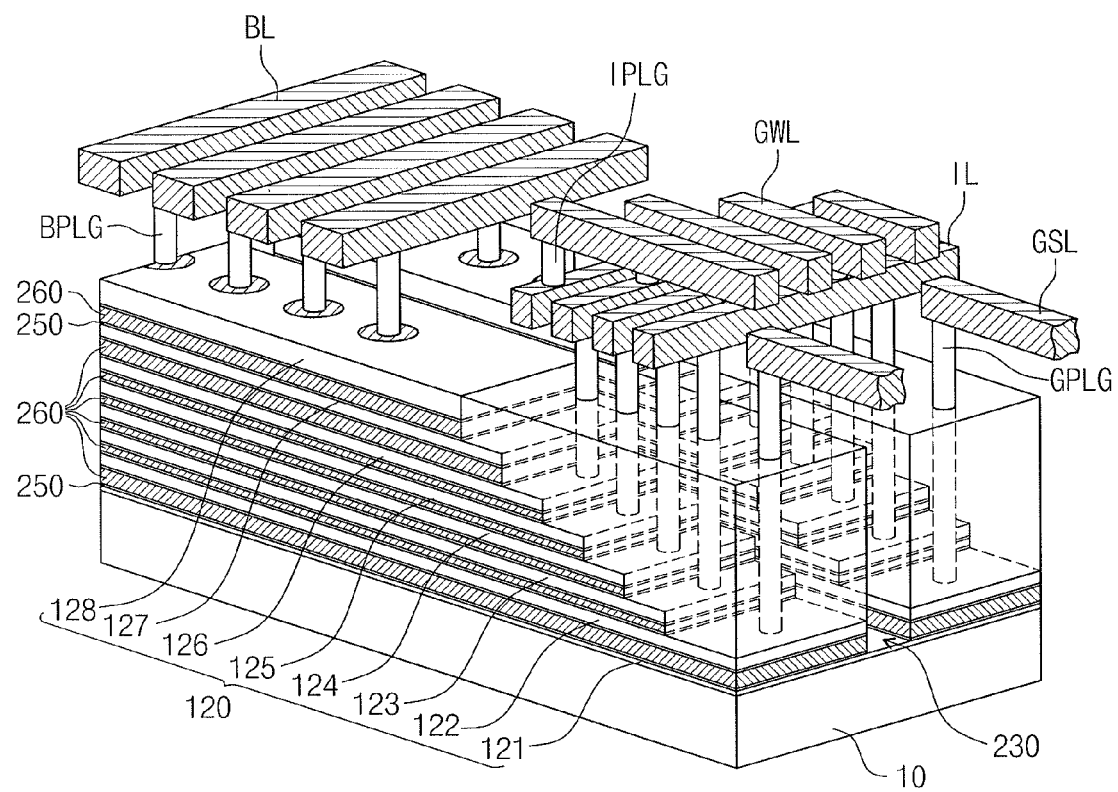

In the example operations shown in FIGS. 18 through 20, the sacrificial mask pattern 310 is removed and the sacrificial films 130 are selectively removed from the thin film structure 100 to form recessed regions 240. Subsequently, the conductive patterns 260 facing the sidewall of the semiconductor patterns 205 are formed by filling the recessed regions 240, and then the word line plugs WPLG connected to the conductive patterns 260 are formed. Consequently, according to this embodiment, the conductive patterns 260 may be formed after the thin film structure 100 is formed in the step shape during the exhaustive etching.

Further to the above, the forming of the recessed regions 240 may include: forming the trenches 230 exposing the sidewalls of the sacrificial films 130 in the thin film structure 100, as illustrated in FIG. 18; and removing the exposed sacrificial films 130 selectively, as illustrated in FIG. 19. In this example, the forming of the recessed regions may be performed in the same way as that described in the above-described embodiment with reference to FIGS. 8 and 9.

As illustrated in FIG. 18, the trench 230 may extend in its longitudinal direction from the cell array region CAR to traverse the word line contact region WCTR. In this regard, according to the first embodiment, the trench 230 is formed so as not to traverse the word line contact region WCTR so that the word line WL may be formed in the comb shape or the finger shape. By comparison, according to the second embodiment, the trench 230 may be formed so as to traverse the word line contact region WCTR to isolate the thin film structure 100 into plural portions arranged horizontally. In other implementations, the trench 230 described with reference to FIG. 19 may be applied to the first embodiment and the trench 230 described with reference to FIG. 9 may be applied to the second embodiment.

In the present example method, the forming of the conductive patterns 260 may be performed in the same way as in the embodiment described above with reference to FIG. 10. Thus, replacing the sacrificial films 130 with a conductive material may include filling the recessed regions 240 with the data storage film 250 and the conductive pattern 260, and the conductive patterns 260 may be isolated spatially from each other by the electrode isolation pattern 265 filling the trench 230.

Referring to FIG. 20, after the word line plugs WPLG are formed, the global word lines GWL may further be formed to be connected to the word line plugs WPLG. The ground selection lines GSL may further be formed to be electrically connected to the conductive patterns 260 of the lowermost film, respectively. Moreover, the bit line plugs BPLG may further be formed to be connected to the semiconductor patterns 205 and the bit lines BL may further be formed to be connected to the bit line plugs BPLG. The word line plugs WPLG, the global word lines GWL, the ground selection line GSL, the bit line plugs BPLG, and the bit lines BL may be formed by the same method as that described in the embodiment with reference to FIGS. 13 and 14.

As described above, the thin film structure 100 including the sacrificial films 130 may be isolated into the plural portions arranged horizontally. With such a configuration, the conductive patterns 260 formed in the replacing operation (operation S32) may be isolated from each other by the trenches 230, respectively, and thus the plural conductive lines may be formed. Therefore, the word line plugs WPLG according to this embodiment may be formed to be connected respectively to the conductive patterns 260 isolated horizontally by the trench 230, as illustrated in FIG. 20. Moreover, the conductive patterns 260 arranged with the same height may be connected electrically to one of the global word lines GWL. In order to make this connection, between the word line plugs WPLG and the global word lines GWL, an intermediate line IL may further be arranged to connect the plural word line plugs WPLG to each other and an intermediate plug IPLG may further be arranged to connect the intermediate line IL to the global word line GWL. According to this embodiment, the long axis of the intermediate line IL may be parallel to the long axis of the bit line BL, as illustrated in FIG. 20.

Figure 21:
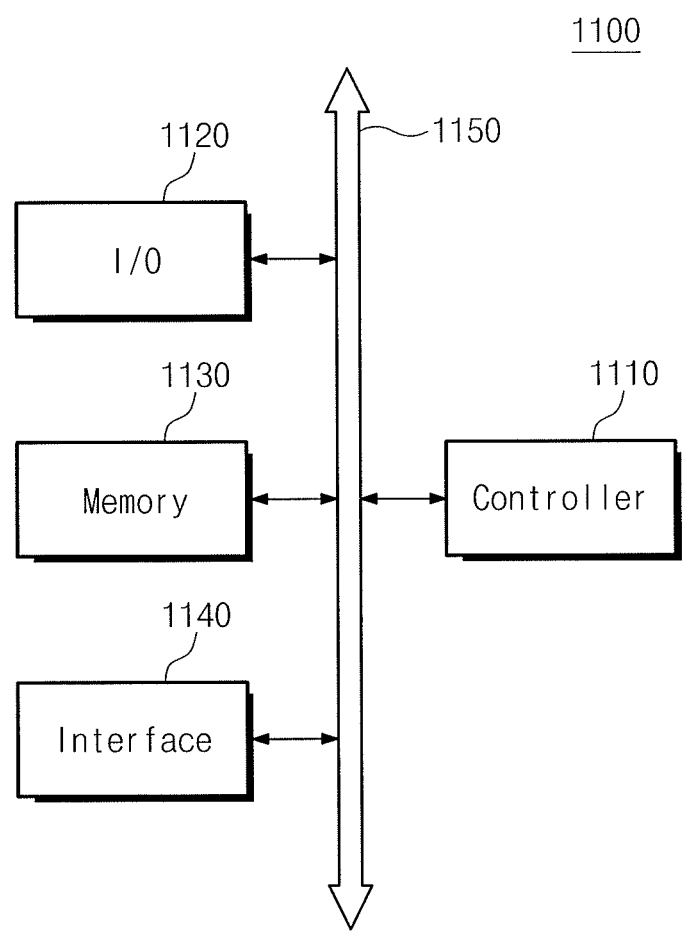
FIG. 21 illustrates a schematic block diagram of a memory system including a three-dimensional semiconductor memory device according to an example embodiment.

FIG. 21 illustrates a schematic block diagram of a memory system including a three-dimensional semiconductor memory device according to an example embodiment.

Referring to FIG. 21, a memory system 1100 may be applied to, e.g., a PDA, a portable computer, a web tablet, a wireless phone, a mobile phone, a digital music player, a memory card, a device capable of transmitting and/or receiving information in a wireless environment, etc.

The memory system 1100 may include a controller 1110, an input/output (I/O) device 1120 (such as a keypad, a keyboard, or a display device), a memory 1130, an interface 1140, and a bus 1150. The memory 1130 and the interface 1140 may communicate with each other through the bus 1150.

The controller 1110 may include at least one of a microprocessor, a digital signal processor, a microcontroller, or another process unit similar thereto. The memory 1130 may be used to store commands executed by the controller 1110. The input/output device 1120 may receive data or signals from the outside of the memory system 1100, and/or output data or signals to the outside of the memory system 1100. For example, the input/output device 1120 may include a keyboard, a keypad, a display device or touchscreen, etc.

The memory 1130 may include a three-dimensional semiconductor memory device according to an embodiment, which may be, e.g., a nonvolatile memory such as a flash memory. The memory 1130 may further include another kind of memory, e.g., a volatile memory capable of being accessed at any time, or other various kinds of memories.

The interface 1140 may transmit data to a communication network and/or receive data from a communication network.

Figure 22:
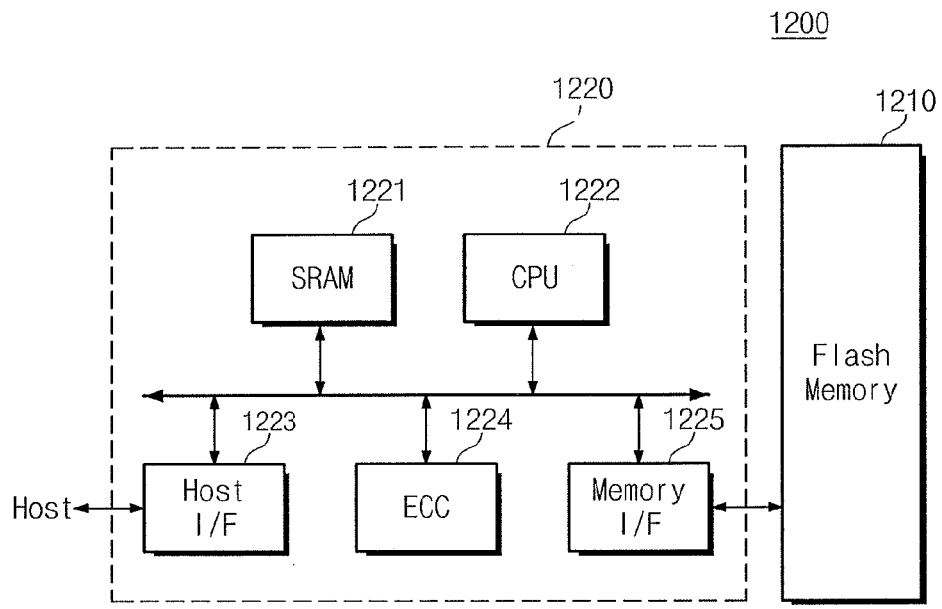
FIG. 22 illustrates a schematic block diagram of a memory card including a three-dimensional semiconductor memory device according to an example embodiments.

FIG. 22 illustrates a schematic block diagram of a memory card including a three-dimensional semiconductor memory device according to an example embodiments.

Referring to FIG. 22, a memory card 1200 supporting a mass data storing ability may be mounted with a flash memory device 1210 according to an embodiment. The memory card 1200 may include a memory controller 1220 generally controlling data exchange between a host and the flash memory device 1210.

An SRAM 1221 may be used as a work memory of a processing unit 1222. A host interface 1223 may have a data exchange protocol of a host connected to the memory card 1200. An error correction coding block 1224 may detect and correct an error contained in data read from the multi-bit flash memory device 1210. A memory interface 1225 may interface the flash memory device 1210 according to an embodiment. The processing unit 1222 may generally control data exchange of the memory controller 1220. The memory card 1200 may further be provided with a ROM (not illustrated) storing code data used to interface the host.

In devices such as the flash memory device, the memory card, or the memory system, it may be possible to provide a highly reliable memory system that exhibits improved erasing characteristics of dummy cells by using the flash memory device 1210. In an implementation, the flash memory device may be provided in a memory system such as a solid state drive or solid state disk (SSD). In this case, a highly reliable memory system may be realized by preventing a reading error caused from the dummy cell.

Figure 23:
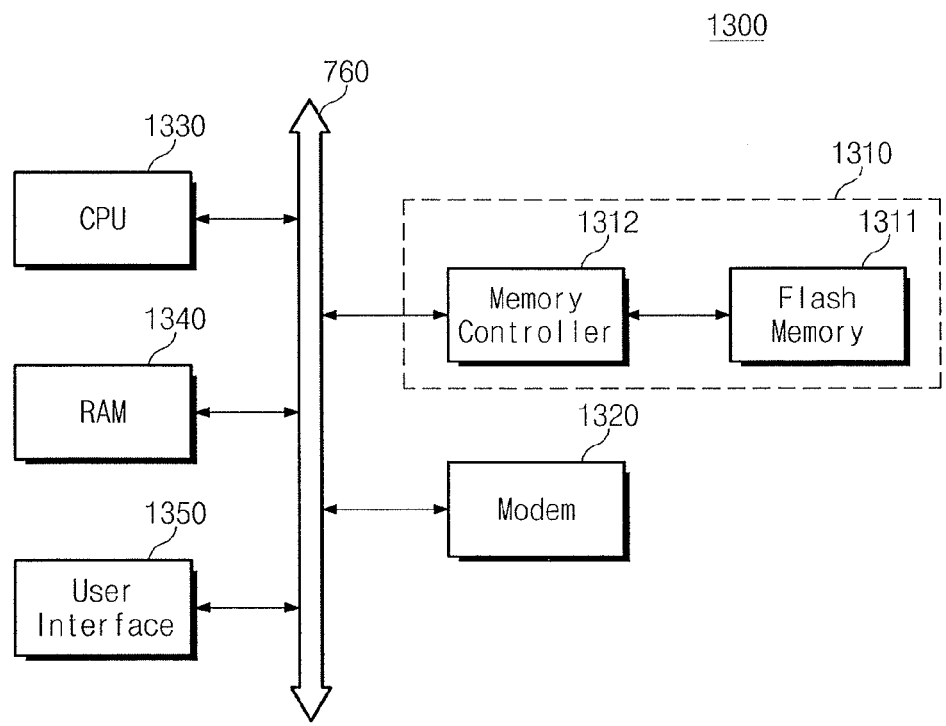
FIG. 23 illustrates a schematic block diagram of an information processing system including a three-dimensional semiconductor memory device according to an example embodiment.

FIG. 23 illustrates a schematic block diagram of an information processing system including a three-dimensional semiconductor memory device according to an example embodiment.

Referring to FIG. 23, a flash memory system 1310 according to an embodiment may mounted in an information processing system 1300 such as a mobile device, a desktop computer, etc. The information processing system 1300 may include a modem 1320, a central processing unit 1330, a RAM 1340, and a user interface 1350 electrically connected to the flash memory system 1310 via a system bus 1360. The flash memory 1310 may have substantially the same configuration as the memory system or the flash memory system disclosed above. The flash memory system 1310 may store data processed by the central processing unit 1330 and/or data input from the outside. The above-described flash memory system 1310 may be formed as a solid state drive or solid state disk (SSD). In this case, the information processing system 1300 may stably store large amounts of data in the flash memory system 1310. The resources necessary for error correction may be saved with an increase in reliability in the flash memory system 1310. Thus, a high-speed data exchanging function may be provided to the information processing system 1300. An application chipset, a camera image processor (CIS), an input/output device, or the like (not shown) may further be included in the information processing system 1300 according to the present embodiment.

The flash memory device or the memory system according an embodiment may be realized in various types of packages. For example, the flash memory device or the memory system according may be packaged as package on package (PoP), ball grid array (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline integrated circuit (SOIC), shrink small outline package (SSOP), thin small outline package (TSOP), thin quad flatpack (TQFP), system in package (SIP), multi chip package (MCP), wafer-level fabricated package (WFP), or wafer-level processed stack package (WSP).

In two-dimensional or planar semiconductor memory devices, the degree of integration is determined by an occupying area of a unit memory cell. Thus, the degree of integration is considerably affected by the level of technique for forming fine patterns. However, the degree of integration of the two dimensional memory semiconductor devices has been restricted since very expensive equipment is necessary to realize minute patterns. A three-dimensional semiconductor memory device, including memory cells arranged three-dimensionally, may overcome or mitigate these restrictions. To enable mass production of a three-dimensional memory device, a fabricating technique is expected to provide reliable product characteristics while reducing a fabricating cost per bit beyond than that of two dimensional semiconductor memory devices.

Embodiments relate to a semiconductor memory device and a method of fabricating the same. Embodiments may provide a method of fabricating a semiconductor memory device with a three-dimensional structure that exhibits improved in electric characteristics, a three-dimensional memory device made thereby. In the three-dimensional semiconductor memory device, voltages may be applied to the ground selection lines. Accordingly, it may be possible to reduce a data read disturbance in the selected cell string.

Example embodiments have been disclosed herein, and although specific terms are employed, they are used and are to be interpreted in a generic and descriptive sense only and not for purpose of limitation. For example, embodiments are not limited to flash memory devices, and the data storage film and the conductive film described above in the context of a flash memory device may be modified so as to have various structures. Accordingly, it will be understood by those of skill in the art that various changes in form and details may be made without departing from the spirit and scope of the present invention as set forth in the following claims.

What is claimed is:

1. A semiconductor memory device, comprising:
a substrate having a cell array region and a contact region;
lower conductive patterns on the substrate, the lower conductive patterns being electrically isolated from each other;
an isolation pattern between the lower conductive patterns in the contact region to electrically isolate the lower conductive patterns from each other;
intermediate conductive patterns sequentially stacked on the lower conductive patterns;
upper conductive patterns on the intermediate conductive patterns; and
semiconductor patterns that penetrate the intermediate conductive patterns to be connected to the substrate in the cell array region.

2. The semiconductor memory device as claimed in claim 1, further comprising:
electrode isolation patterns that are spaced apart from the semiconductor patterns in the cell array region and penetrate the lower conductive patterns, the intermediate conductive patterns, and the upper conductive patterns.

3. The semiconductor memory device as claimed in claim 2, wherein end portions of the intermediate conductive patterns are connected to each other in an upper portion of the isolation pattern, the end portions being arranged at a same distance from the substrate.

4. The semiconductor memory device as claimed in claim 2, wherein the lower conductive patterns are electrically isolated from each other by the electrode isolation pattern and the isolation pattern.

5. The semiconductor memory device as claimed in claim 2, wherein the isolation pattern has a width equal to or smaller than that of a distance between the lower conductive patterns.

6. The semiconductor memory device as claimed in claim 1, wherein respective lengths of the intermediate conductive patterns decrease as a distance between the intermediate conductive patterns and the substrate increases.

7. The semiconductor memory device as claimed in claim 1, further comprising:
   a data storage film interposed between the intermediate conductive patterns and the semiconductor pattern.

8. The semiconductor memory device as claimed in claim 7, wherein the data storage film covers upper and bottom surfaces of the conductive patterns.

\* \* \* \* \*